US010775836B2

United States Patent
Prakash et al.

(10) Patent No.: US 10,775,836 B2
(45) Date of Patent: Sep. 15, 2020

(54) METHOD FOR CYCLE ACCURATE DATA TRANSFER IN A SKEWED SYNCHRONOUS CLOCK DOMAIN

(71) Applicant: Synopsys, Inc., Mountain View, CA (US)

(72) Inventors: Gyan Prakash, Hatia Ranchi (IN); Nidhir Kumar, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 142 days.

(21) Appl. No.: 15/573,917

(22) PCT Filed: Jun. 14, 2016

(86) PCT No.: PCT/IN2016/000155
§ 371 (c)(1),
(2) Date: Nov. 14, 2017

(87) PCT Pub. No.: WO2016/203492
PCT Pub. Date: Dec. 22, 2016

(65) Prior Publication Data
US 2019/0004564 A1    Jan. 3, 2019

(30) Foreign Application Priority Data
Jun. 16, 2015   (IN) .......................... 1277/CHE/20015

(51) Int. Cl.
*G06F 1/12* (2006.01)
*G06F 1/04* (2006.01)
(Continued)

(52) U.S. Cl.
CPC .................. *G06F 1/12* (2013.01); *G06F 1/04* (2013.01); *G06F 5/06* (2013.01); *G06F 5/10* (2013.01);
(Continued)

(58) Field of Classification Search
CPC ..... G06F 1/10; G06F 1/14; G06F 1/12; G06F 2205/123; G06F 5/06; G06F 5/10;
(Continued)

(56) References Cited

U.S. PATENT DOCUMENTS 6,696,854 B2 * 2/2004 Momtaz .................... G06F 5/10
326/37
7,519,746 B2 * 4/2009 Shiraishi ................... G06F 5/14
710/52
(Continued)

FOREIGN PATENT DOCUMENTS

WO   WO 2012/013972 A1   2/2012

OTHER PUBLICATIONS

PCT International Search Report and Written Opinion, PCT Application No. PCT/IN2016/000155, dated Jan. 31, 2017, eight pages.

*Primary Examiner* — Fahmida Rahman
(74) *Attorney, Agent, or Firm* — Fenwick & West LLP

(57) ABSTRACT

A method and system for cycle accurate data transfer between skewed source synchronous clocks is envisaged. The procedure starts through reset. On reset, both the write and read address registers are set to point to location 0. Source clock is stopped to disable active clock edges to both write and read address registers during the reset procedure. The source clock is subsequently started to deliver active edges w both write and read address registers. On every active source clock edge, data is pushed into the data register based on the location pointed by write address resister. On every skewed active clock edge, data is read from the data register based on the address pointed by read address register. Due to the delayed nature of clock reaching the read address register, write address register increments first and stores data into the data register.

5 Claims, 5 Drawing Sheets

(51) Int. Cl.
*G11C 7/22* (2006.01)
*G11C 7/10* (2006.01)
*G06F 5/06* (2006.01)
*G06F 5/10* (2006.01)
*G06F 9/38* (2018.01)
*G06F 9/30* (2018.01)
*H03K 19/20* (2006.01)

(52) U.S. Cl.
CPC ........ G06F 9/30141 (2013.01); G06F 9/3869 (2013.01); G11C 7/10 (2013.01); G11C 7/1093 (2013.01); G11C 7/22 (2013.01); *G06F 2205/123* (2013.01); *H03K 19/20* (2013.01)

(58) Field of Classification Search
CPC ..... G06F 9/3869; G06F 9/30141; G11C 7/22; G11C 7/10; G11C 7/1093; G11C 19/20
See application file for complete search history.

(56) References Cited

U.S. PATENT DOCUMENTS

| | | | |
|---|---|---|---|
| 8,612,651 B2 * | 12/2013 | Boonstra | G06F 5/12 710/57 |
| 8,775,701 B1 | 7/2014 | Fung | |
| 10,025,343 B2 * | 7/2018 | Rifani | G06F 1/12 |
| 2005/0122794 A1 * | 6/2005 | Chard | G06F 5/12 365/189.12 |

\* cited by examiner

METHOD FOR CYCLE ACCURATE DATA TRANSFER IN A SKEWED SYNCHRONOUS CLOCK DOMAIN

CROSS REFERENCE TO RELAXED APPLICATIONS

This Patent Application is a National Phase Application corresponding to the PCT Application No. PCT/IN2016/000155 filed on Jun. 14, 2016 with the title "METHOD FOR CYCLE ACCURATE DATA TRANSFER IN A SKEWED SYNCHRONOUS CLOCK DOMAIN". This Patent Application claims the priority of the Indian Provisional Patent Application No. 1277/CHE/2015 filed on Jun. 16, 2015 with the title "CYCLE ACCURATE DATA TRANSFER BETWEEN SKEWED SYNCHRONOUS CLOCKS", the contents of which is included herein by the way of reference.

BACKGROUND

Technical Field

The present disclosure relates to the field of electronic circuits. Particularly, the present disclosure relates to synchronization of different clock domains. More particularly, the present disclosure relates to the synchronization of data transfer between a first clock domain and a second clock domain.

Description of the Related Art

In current digital transmission networks, multiple clock domains coexist. The said multiple clock domains could be synchronized with reference to a source clock or otherwise (asynchronous). However, during data transfer, certain IP (Internet Protocol) block mandate data to be transferred from a given clock domain to other source synchronous clock domains only. Further, these IP blocks typically manipulate the degree of skew between the clock domains, in line with the specifics of the Internet Protocol (IP).

Further, a larger clock skew negatively impacts the accuracy of data transfer by either introducing metastability or by introducing cycle mismatch. One of the conventional solutions to achieve synchronization between different clock domains is to introduce a double/triple flip-flop based synchronizer. However, use of a double/triple flip-flop based synchronizer is not entirely feasible given the uncertainty associated with the clock cycles thereof and also since the transmitted data needs to remain stable at least across the receiving clock, to be accurately captured. Further, a double/triple flip-flop based synchronizer would also prevent data toggling at consecutive active clock edges of the transferring clock to be reliably captured.

To overcome the aforementioned drawback, a dual port element such as a FIFO (First In First Out) mechanism was proposed. When the FIFO is utilized, the data is filled thereto on the source cock domain, and the filled data is drained at the destination clock domain. However, even though the FIFO based approach solves the problems associated with data toggling at consecutive active clock edges, it fails to address the issue of cycle accurate data transfer given the presence of variable latency between the FIFO read operation and the FIFO write operation. Moreover, the approaches described hitherto are not effective when the data is to be transferred in a cycle accurate manner between clock domains having a large skew rate.

Therefore, to overcome the drawbacks mentioned hitherto, there was felt a need for a system and method that provides for cycle accurate data transfer between clock networks present across different clock domains. Further, there was also felt a need for a system and method that efficiently overcomes the drawbacks associated with the presence of a large clock skew. Further, there was also felt a need for a system and method that obviates the latency associated with data transfer between two different clock domains.

OBJECTS

An object of the present disclosure is to provide a system and method that enables cycle accurate data transfer.

Yet another object of the present disclosure is to provide a system and method that provides for cycle accurate data transfer between different clock domains.

Still a further object of the present disclosure is to provide a system and method that obviates the skew and the corresponding repercussions during data transfer between different clock domains.

One more object of the present disclosure is to provide a system and method that maintains an accurate timing relationship during data transfer between different clock domains.

Yet another object of the present disclosure is to provide a system and method that does not necessitate addition of variable latency during synchronization between the clock domains.

Still a further object of the present disclosure is to provide a system and method that does not warrant the availability of enable signal for reading the transferred data.

Yet another object of the present disclosure is to synchronize the data transfer between different clock domains, taking into consideration the phase delay there between.

One more object of the present disclosure is to transfer the data from a source to a destination without consuming any additional clock cycles.

SUMMARY

The present disclosure envisages a method for cycle accurate data transfer between skewed source synchronous clock domains. In accordance with the present disclosure, a write address register, a read address register and a data register are utilized to ensure cycle accurate data transfer between skewed source synchronous clock domains. In accordance with the present disclosure, the Least Significant Bit (LSB) of the write address is initialized to a value '1', and the remaining bits including the Most Significant Bit (MSB) are initialized to a value '0'. The write address register and the read address registers are 1-hot encoded registers which hold only one of their bits at any given point of time at the value '1'. Further, the Least Significant Bit (LSB) of the read address is initialized to a value '1', and the remaining bits including the Most Significant Bit (MSB) are initialized to a value '0'.

In accordance with the present disclosure, for every active clock edge (corresponding to the clock signal), the LSB of the read address register and the write address register shifts by one position. When a memory write signal is issued, the data is pushed into the data register based on the position of a 'write address register bit' storing a value '1'. Similarly, when a memory read signal is issued, the data is read from the data register based at least on the position of a 'read address register bit' storing a value '1'.

In accordance with the present disclosure, after system reset is done, and a source clock signal is made available to the write address register, the original bits of the write address register are inverted (transformed from '0' to '1' or vice-versa) using an AND gate equipped with bubble logic. Subsequently, a first AND operation is performed between the inverted bits (of the write address register) and the contents (previously) stored in the data register. A first bit pattern is generated as a result of the first AND operation.

Subsequently, a second AND operation is performed between the non-inverted original bits of the write address register and the data to be pushed into the data register, and a second bit pattern is generated. Subsequently, a first OR operation is performed using the first bit pattern and the second bit pattern, and based on the result thereof, the data register is updated.

In accordance with the present disclosure, when skewed source synchronous clock is made available to read register, an AND operation between the bits of the read address register, and the contents of the data register is initiated, and subsequently a third bit pattern is generated. Further, a second OR operation is performed on the third bit pattern, and the data is read from the data register based on the result of the second OR operation.

BRIEF DESCRIPTION OF THE DRAWINGS

The other objects, features and advantages will occur to those skilled in the art from the following description of the preferred embodiment and the accompanying drawings in which.

DETAILED DESCRIPTION

Figure 1:
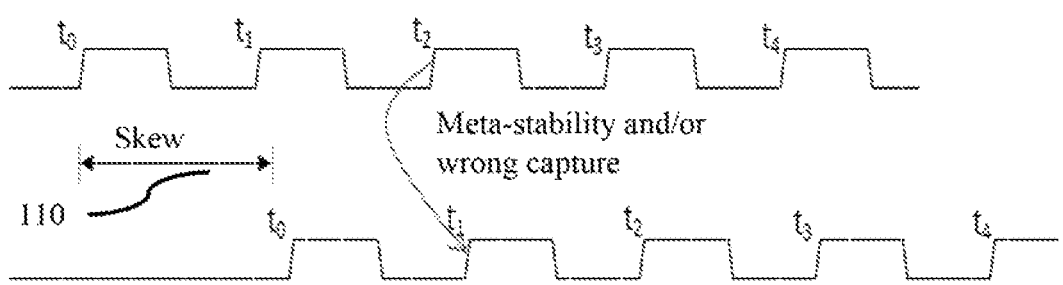
FIG. 1 illustrates a timing diagram to show the data reliability issue when transferring data from one clock domain to a skewed source synchronous clock domain, in accordance with the present disclosure.

FIG. 1 illustrates a timing chart to show the data reliability issue when transferring data from source clock domain to a skewed source synchronous clock domain of a digital system, according to one embodiment of the present disclosure.

The timing chart 100 as shown in FIG. 1 illustrates the clock signals of the source clock and the (source synchronous skewed) destination clock. As illustrated in the timing diagram 100, the destination clock has a large skew symbolically represented by 110. As illustrated in the timing diagram 100, any data launched from the $t_1$ edge of the source should be captured on the $t_2$ edge of the destination. If the skew between the (source and destination) clocks is large, the digital system has no means to detect the correct destination $t_2$ edge as the $t_1$ destination edge appears near to the $t_2$ source edge. Instead of the data being captured on the $t_2$ destination edge, the data is susceptible to be captured on the $t_1$ destination edge. Alternatively, the data capture by the $t_2$ can take place even early based on the skew of the system. This leads to the error in the data read and write mechanism.

Figure 2A:
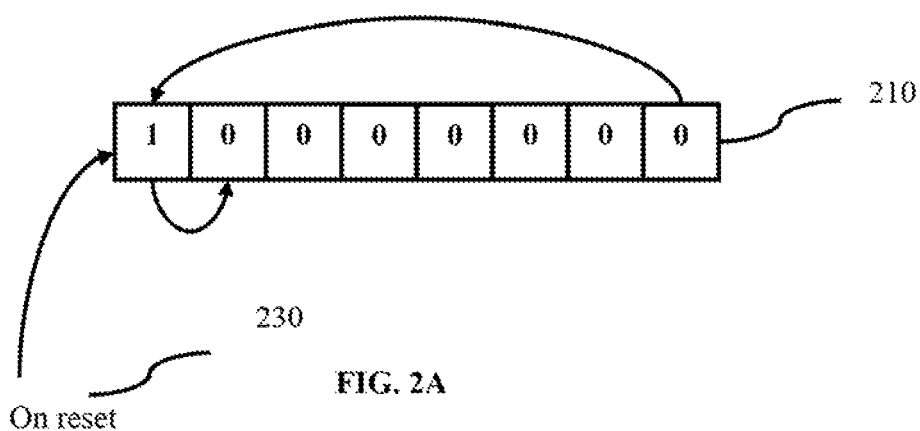
FIG. 2A illustrates the 1-hot, variable depth write address register, in accordance with the present disclosure.

FIG. 2A illustrates the 1-hot, variable depth write register 210, in accordance with the present disclosure. The write address register 210 is 1-hot encoded set of registers that holds the current address of the data that has to be written into the data register. 1-hot encoding refers to one of the bits in the register set to 1, and the rest of the bits of the register set to 0. Examples of the 1-hot encoding of the registers include 00000001, 10000000, 00010000, and the like.

In accordance with the present disclosure, on reset 230, the least significant bit (LSB) position of write address register 210 holds the value '1' and the other positions including the most significant bit (MSB) hold the value '0'. On every active clock edge, the LSB of the write address register 210 rotates in a circular manner with the LSB data moved to the MSB position and the MSB data is moved to position MSB-1 and so on.

Figure 2B:
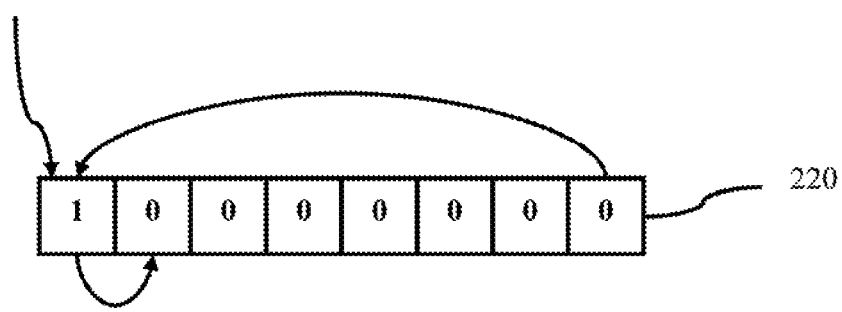
FIG. 2B illustrates the 1-hot, variable depth read address register, in accordance with the present disclosure.

FIG. 2B illustrates the 1-hot, variable depth read address register 220, in accordance with the present disclosure. The read address register 220 is 1-hot encoded set of registers that holds the current address of the data that has to be read from the data register. In accordance with the present disclosure, on reset 230, the least significant bit (LSB) position of the read address register 220 holds the value '1' and the other positions including the most significant bit (MSB) hold the value '0'. On every active clock edge, the LSB of the read address register 220 rotates in a circular manner with the LSB data moved to the MSB position and the MSB data is moved to MSB-1 and so on.

Figure 3:
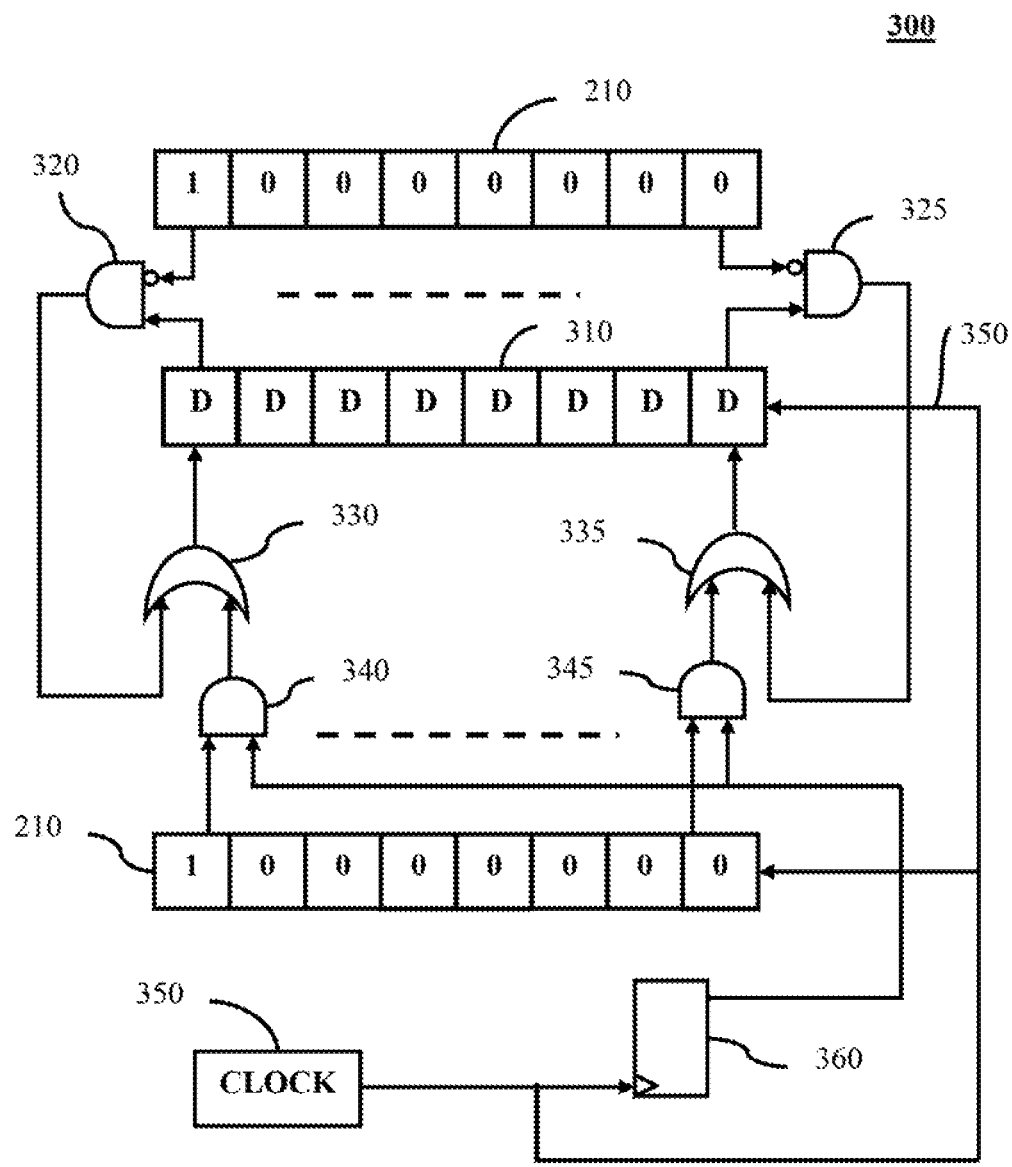
FIG. 3 illustrates write function to a data register, in accordance with the present disclosure.

FIG. 3 illustrates the implementation of a write function on the data register 310, in accordance with the present disclosure. FIG. 3 includes a write address register 210, a data register 310, a plurality of AND gates 320, 325 with bubble logic, a plurality of AND gates 340, 345 without bubble logic, a plurality of OR gates 330, 335, and a clock source 350.

In accordance with the present disclosure, a reset signal is applied to initialize the write address register 210 and the read address register 220 to point out to a memory location '0'. The clock source 350 is stopped to disable active clock edges to both the write address register 210 and the read address register 220 during the reset to ensure clock and reset timing relationship. The clock source 350 is started after the reset active clock edges are delivered to the write address register 210, the read address register 220 and the data register 310.

In accordance with the present disclosure, on every active source clock edge, the data register 310 is updated as described herein: based on the current 1-hot bit position of the write address register 210, the new data (either '0' or '1') is pushed into a bit position of the data register 310. For example, if the write address register ($w_{adr}$) 210 forms a pattern 000100, the data register ($d_{atar}$) 310 forms a pattern 110001, the new data ($n_{data}$) 360 to be transferred is 1. The new value ($n_{datar}$) of data register 310 is given be a Boolean equation: $n_{datar}=(w_{adr} \cdot n_{data})|(!w_{adr} \cdot d_{atar})$, which is 110101 in this example. Subsequently, the write address register 210 is shifted to point to the next memory location. In accordance with the present disclosure, both 0 and 1 are considered active data to be transferred.

Figure 4:
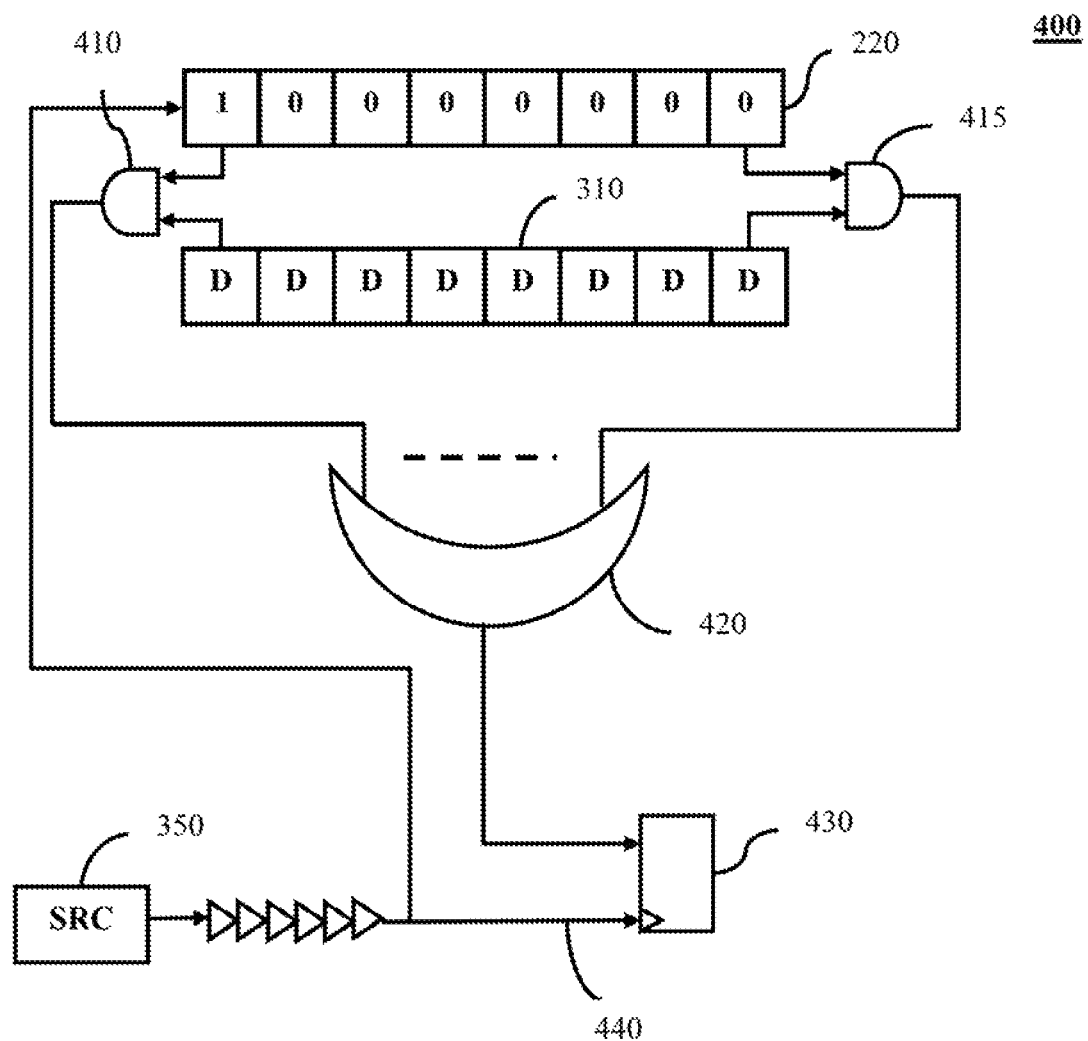
FIG. 4 illustrates a read function of the data register, in accordance with the present disclosure.

FIG. 4 illustrates an implementation of a read function of the data register, in accordance with the present disclosure.

FIG. 4 includes a read address register 220, the data register 310, plurality of AND gates 410 and 415, an OR gate 420, new data 430, a skewed source synchronous clock 440. On every active skewed clock edge, the read functionality is achieved using the steps mentioned herein: based on the current 1-ho: bit position of read address register 220, the data is read from the data register 310. For example, if the read address register ($r_{adr}$) is 001000, and the data register ($d_{atar}$) is 110001, then the new data ($n_{data}$) is given by Boolean equation: $n_{data}=(r_{datr} \cdot d_{atar})$, which is '0' in this example. Subsequently, the read address register 220 is shifted to point to next location.

Further, in accordance with the present disclosure, there are address increments on every active edge of the clock. Due to the delayed nature of the (source synchronous skewed) clock reaching the read address register 220, the write address register 210 increments first and stores data into the data register subsequently followed by reading the data register 310 based on read address register 220. Further, according to the present disclosure, the depth of the read address register, write address register and data register is equivalent and depends on the skew of the clock source.

Figure 5:
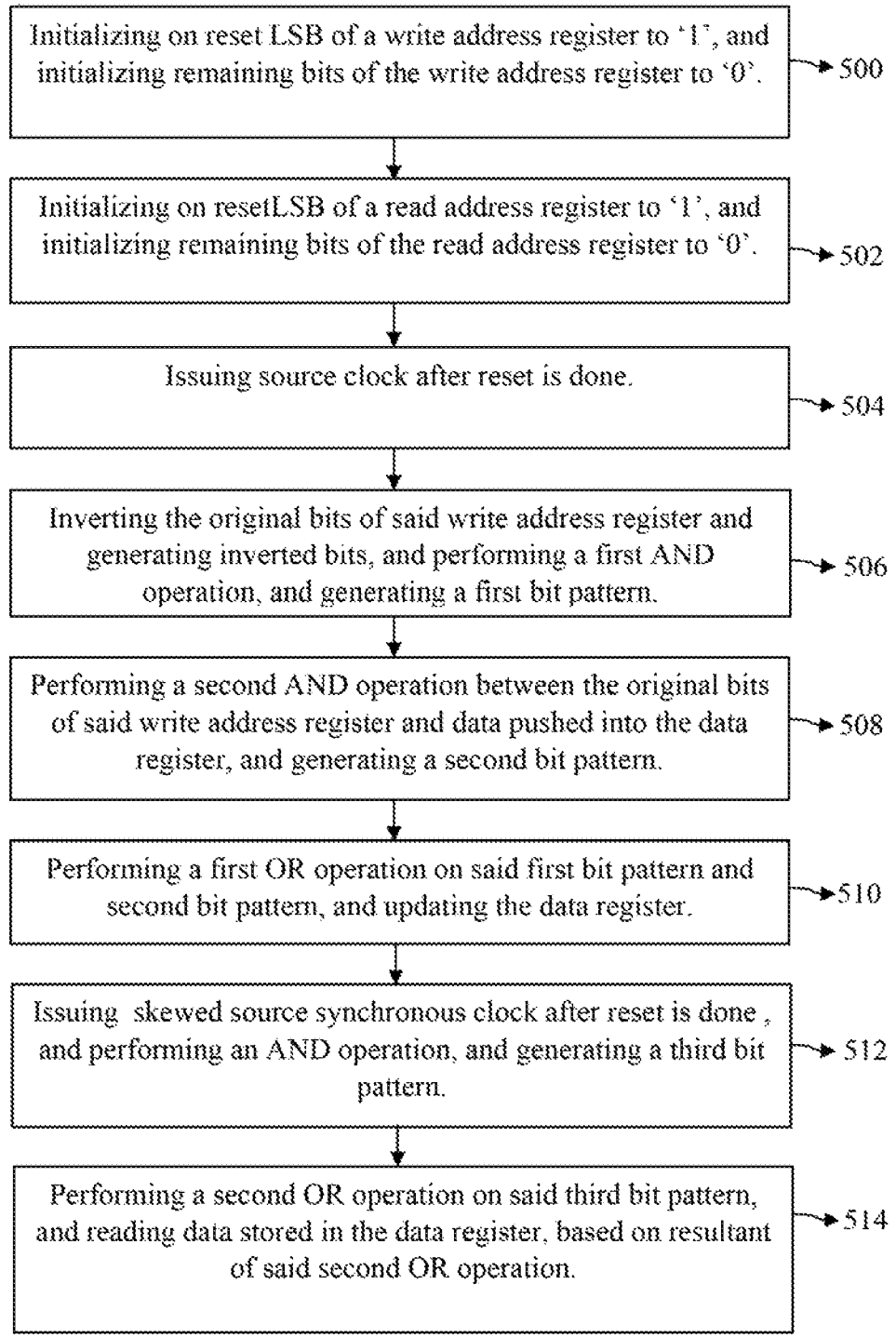
FIG. 5 illustrates the method to achieve cycle accurate data transfer between source synchronous skewed clock domains Although the specific features of the present invention are shown in some drawings and not in others, this is done for convenience only as each feature may be combined with any or all of the other features in accordance with the present disclosure.

Referring to FIG. 5, there is shown a flowchart illustrating the method for performing data write and data read operations on a data register in a skewed synchronous clock domain. The method, in accordance with the present disclosure comprises the following steps:

initializing on reset, Least Significant Bit (LSB) of a write address register to '1', and initializing remaining bits of the write address register to '0', such that the LSB of the write address register holds '1' and at least a Most Significant Bit (MSB) of the write address register holds '0' (step 500);

initializing on reset, Least Significant Bit (LSB) of a read address register to '1', and initializing remaining bits of the read address register to '0', such that the LSB of the read address register holds '1', and at least a Most Significant Bit (MSB) of the read address register holds '0' (step 502).

issuing source clock after reset and pushing data into the data register based at least on the position of a write address register bit storing a value '1' (step 504);

inverting the original bits of the write address register and generating inverted bits, and performing a first AND operation between the inverted bits and contents stored in the data register, and generating a first bit pattern as a resultant of the first AND operation (step 506);

performing, a second AND operation between the original bits of the write address register and data pushed into the data register, and generating a second bit pattern as a resultant of the second AND operation (step 508);

performing a first OR operation on the first bit pattern and second bit pattern, and updating the data register based on resultant of the first OR operation (step 510);

issuing skewed source synchronous clock after reset and performing an AND operation between the bits of the read address register and the contents stored data register, and generating a third bit pattern (step 512);

performing a second OR operation on the third bit pattern, and reading data stored in the data register, based on resultant of the second OR operation (step 514).

In accordance with the present disclosure, the method further includes the step of rotating the Least Significant Bit (LSB) of the write address register and the read address register by at least one position per one active clock edge.

In accordance with the present disclosure, the step of inverting the original bits of the write address register, further includes the step of inverting the original bits using an AND gate with bubble logic.

In accordance with the present disclosure, the step of pushing data into the data register, further includes the step of extracting the data stored in a memory location pointed to by the write address register bit storing the value '1'.

In accordance with the present disclosure, the method further includes the step of selecting the number of bits in the write address register and the read address register, based on the phase shift between the source clock and the destination clock.

In accordance with the present disclosure, the method further includes the step of selecting the number of bits in the data register to be equivalent to the number of bits in the write address register and the read address register.

The foregoing description of the specific embodiments will so fully reveal the general nature of the embodiments herein that others can, by applying current knowledge, readily modify and/or adapt for various applications such embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments herein can be practiced with modifications.

The technical advantages envisaged by the present disclosure include the realization of a system and method that enables cycle accurate data transfer. Further, the system and method envisaged by the present disclosure also provides for cycle accurate data transfer between skewed source synchronous clock domains. Further, the system and method obviate the skew and the corresponding repercussions during data transfer between different clock domains. Further, the system and method provide for maintaining an accurate timing relationship during data transfer between different clock domains. Further, the system and method do not bring about addition of variable latency and necessitate availability of additional clock cycles.

What is claimed is:
1. A method for performing data write and data read operations on a data register in a skewed synchronous clock domain, said method comprising the following steps:

initializing on reset, Least Significant Bit (LSB) of a write address register to '1', and initializing remaining bits of the write address register to '0', such that the LSB of the write address register holds 1' and at least a Most Significant Bit (MSB) of the write address register holds '0';

initializing on the reset, Least Significant Bit (LSB) of a read address register to '1', and initializing remaining bits of the read address register to '0', such that the LSB of the read address register holds '1', and at least a Most Significant Bit (MSB) of the read address register holds '0';

issuing a source clock after the reset and extracting data stored in a memory location pointed to by a write address register bit storing a value '1', and preparing for extracted data to be pushed into the data register;

inverting original bits of said write address register and generating inverted bits, and performing a first AND operation between the inverted bits and contents previously stored in the data register, and generating a first bit pattern as a resultant of said first AND operation;

performing a second AND operation between the original bits of the write address register and the data to be pushed into the data register, and generating a second bit pattern as a resultant of said second AND operation;

performing a first OR operation on said first bit pattern and second bit pattern, and updating the data register based on resultant of said first OR operation;

issuing a skewed source synchronous clock after the reset, and performing an AND operation between bits of the read address register and the contents stored in the data register, and generating a third bit pattern;

performing a second OR operation on said third bit pattern, and reading data stored in the data register, based on resultant of said second OR operation.

2. The method as claimed in claim 1, wherein the method further includes the step of rotating the Least Significant Bit (LSB) of the write address register and the read address register by at least one position per one active clock edge.

3. The method as claimed in claim 1, wherein the step of inverting the original bits of said write address register, further includes the step of inverting the original bits using an AND gate with bubble logic.

4. The method as claimed in claim 1, wherein the step of preparing extracted data to be pushed into the data register, further includes the step of pushing the extracted data into the data register, based at least on a position of the write address register bit storing the value '1'.

5. The method as claimed in claim 1, wherein the method further includes the following steps:

selecting the number of bits in the write address register and the read address register, based on the phase shift between the source clock and the destination clock; and selecting number of bits in the data register to be equivalent to the number of bits in the write address register and the read address register.

\* \* \* \* \*